(12) United States Patent
Fukumochi et al.

(10) Patent No.: US 9,391,228 B2
(45) Date of Patent: Jul. 12, 2016

(54) SOLAR MODULE MANUFACTURING METHOD

(71) Applicant: Sanyo Electric Co., Ltd., Moriguchi, Osaka (JP)

(72) Inventors: Shuji Fukumochi, Kaizuka (JP); Yosuke Ishii, Izumiotsu (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 139 days.

(21) Appl. No.: 14/182,525

(22) Filed: Feb. 18, 2014

(65) Prior Publication Data

US 2014/0157580 A1    Jun. 12, 2014

Related U.S. Application Data

(63) Continuation of application No. PCT/JP2012/062140, filed on May 11, 2012.

(30) Foreign Application Priority Data

Aug. 31, 2011  (JP) .................... 2011-189207
Aug. 31, 2011  (JP) .................... 2011-189208

(51) Int. Cl.
| | | |
|---|---|---|
| *B65H 69/02* | (2006.01) | |
| *H01L 31/18* | (2006.01) | |
| *H01L 31/05* | (2014.01) | |
| *H01L 31/02* | (2006.01) | |
| *H01L 31/068* | (2012.01) | |

(52) U.S. Cl.
CPC .......... *H01L 31/18* (2013.01); *H01L 31/02008* (2013.01); *H01L 31/0512* (2013.01); *H01L 31/0516* (2013.01); *H01L 31/0682* (2013.01); *Y02E 10/547* (2013.01); *Y10T 29/49004* (2015.01)

(58) Field of Classification Search
CPC ... H01G 4/1227; C04B 35/4682; B82Y 30/00
See application file for complete search history.

(56) References Cited

U.S. PATENT DOCUMENTS 4,927,770 A * 5/1990 Swanson ......... H01L 31/022441
136/256
5,510,272 A * 4/1996 Morikawa ....... H01L 31/035281
136/244

(Continued)

FOREIGN PATENT DOCUMENTS

| EP | 2109149 A1 | 10/2009 |
| JP | 2009-266848 A | 11/2009 |

(Continued)

*Primary Examiner* — Minh Trinh
(74) *Attorney, Agent, or Firm* — Mots Law, PLLC

(57) ABSTRACT

A method is provided which is suitable for manufacturing a solar module. When a defective solar cell (20*a*) is discovered in a solar cell string (25), a disconnecting step is performed to disconnect the wiring members (30*a*, 30*b*) bonded to the defective solar cell (20*a*) and to the solar cells (20*b*, 20*c*) adjacent to the defective solar cell (20*a*), and to remove the defective solar cell (20*a*) from the solar cell string (25). A reconnecting step is then performed to electrically connect the solar cells (20*b*, 20*c*) that were adjacent to the defective solar cell (20*a*) to a new solar cell (20*d*) by using new wiring members (34*a*, 34*b*), bonding each new wiring member (34*a*, 34*b*) using a resin adhesive to a region closer to the end than the region in which the disconnected end (30*a*1, 30*b*1) of the wiring member of the solar cell (20*b*, 20*c*) adjacent to the defective solar cell (20*a*) had been bonded in order to create a new solar cell string (25*a*).

5 Claims, 8 Drawing Sheets

(56) References Cited

U.S. PATENT DOCUMENTS

| | | | |
|---|---|---|---|
| 7,804,022 B2 * | 9/2010 | De Ceuster | H01L 31/022433 136/243 |
| 2007/0283997 A1 * | 12/2007 | Hachtmann | H01L 31/03928 136/244 |
| 2009/0260672 A1 * | 10/2009 | Taira | H01L 31/0516 136/244 |
| 2010/0018565 A1 | 1/2010 | Funakoshi | |
| 2010/0181011 A1 * | 7/2010 | Hashimoto | H01L 31/188 156/166 |
| 2010/0263705 A1 * | 10/2010 | Ide | H01L 31/1804 136/244 |

FOREIGN PATENT DOCUMENTS

| | | |
|---|---|---|
| JP | 2010-135698 A | 6/2010 |
| JP | 2010-140984 A | 6/2010 |
| JP | 2011-134765 A | 7/2011 |

* cited by examiner

SOLAR MODULE MANUFACTURING METHOD

CROSS-REFERENCE TO RELATED APPLICATIONS

This is a continuation of International Application PCT/JP2012/062140, with an international filing date of May 11, 2011, filed by applicant, the disclosure of which is hereby incorporated by reference in its entirety.

FIELD OF THE INVENTION

The present invention relates to a method for manufacturing a solar module.

BACKGROUND

Interest in solar modules has increased in recent years as an energy source with a low environmental impact. Solar modules are usually provided with a solar cell string having a plurality of solar cells connected electrically by a wiring member.

Solar cells constituting a solar cell string are sometimes damaged when a solar module is manufactured. Patent Document 1 describes the use of damage-free solar cells in a solar cell string made possible by removing any damaged solar cell from the solar cell string and replacing the damaged solar cell with a new solar cell. In Patent Document 1, the solder bonding the solar cell to the wiring member is heated and melted to peel the wiring member from the solar cell.

PRIOR ART DOCUMENTS

Patent Documents

Patent Document 1: Laid-Open Patent Publication No. 2011-134765

SUMMARY

Problem Solved by the Invention

However, when the wiring member is bonded to the solar cell using a resin adhesive, it is difficult to reliably remove the resin adhesive using heat. As a result, the method described in Patent Document 1 cannot be used when wiring members and solar cells are bonded to each other using a resin adhesive.

It is an object of the present invention to provide a manufacturing method suitable for solar modules.

Means of Solving the Problem

A first aspect of the present invention is a method for manufacturing a solar module comprising the steps of: preparing a plurality of solar cells having a first electrode and a second electrode on the same main surface and arranged so each first electrode and second electrode extends from one end to the other end in one direction; creating a solar cell string in which a plurality of solar cells are connected electrically by using a resin adhesive to connect a wiring member to a region outside of the end portion of the first electrode of one solar cell in the one direction in order to electrically connect the wiring member to the first electrode of the one solar cell, while using a resin adhesive to connect the wiring member to a region outside of the end portion of the second electrode of another solar cell in the one direction in order to electrically connect the wiring member to the second electrode of the other solar cell; inspecting the solar cell string for the presence of any defective solar cell, and cutting the wiring members bonding a defective solar cell to the solar cells adjacent to the defective solar cell and removing the defective solar cell from the solar cell string when a defective solar cell has been discovered; and electrically connecting the solar cells adjacent to the defective solar cell to a new solar cell using new wiring members to create a new solar cell string, each new wiring member being bonded using a resin adhesive to a region closer to the end than the region in which the disconnected end of the wiring member of the solar cell adjacent to the defective solar cell had been bonded.

A second aspect of the present invention is a method for manufacturing a solar module comprising the steps of: preparing a plurality of solar cells having a first electrode and a second electrode on the same main surface and arranged so each first electrode and second electrode extends from one end to the other end in one direction; creating a solar cell string in which a plurality of solar cells are connected electrically by using a resin adhesive to connect a wiring member to a region outside of the end portion of the first electrode of one solar cell in the one direction in order to electrically connect the wiring member to the first electrode of the one solar cell, while using a resin adhesive to connect the wiring member to a region outside of the end portion of the second electrode of another solar cell in the one direction in order to electrically connect the wiring member to the second electrode of the other solar cell; inspecting the solar cell string for the presence of any defective solar cell, and cutting the wiring members bonding a defective solar cell to the solar cells adjacent to the defective solar cell and removing the defective solar cell from the solar cell string when a defective solar cell has been discovered; and electrically connecting the solar cells adjacent to the defective solar cell to a new solar cell using new wiring members to create a new solar cell string, each new wiring member being bonded using a resin adhesive so as to straddle the disconnected end of the wiring member of the solar cell adjacent to the defective solar cell.

A third aspect of the present invention is a method for manufacturing a solar module comprising the steps of: preparing a plurality of solar cells having a first electrode and a second electrode on the same main surface and arranged so each first electrode and second electrode extends from one end to the other end in one direction; creating a solar cell string in which a plurality of solar cells are connected electrically by using a resin adhesive to connect a wiring member to a region outside of the end portion of the first electrode of one solar cell in the one direction in order to electrically connect the wiring member to the first electrode of the one solar cell, while using a resin adhesive to connect the wiring member to a region outside of the end portion of the second electrode of another solar cell in the one direction in order to electrically connect the wiring member to the second electrode of the other solar cell; inspecting the solar cell string for the presence of any defective solar cell, and cutting the wiring members bonding a defective solar cell to the solar cells adjacent to the defective solar cell and removing the defective solar cell from the solar cell string when a defective solar cell has been discovered; and electrically connecting the solar cells adjacent to the defective solar cell to a new solar cell using new wiring members to create a new solar cell string, each new wiring member being bonded using a resin adhesive so as to straddle the resin adhesive of the solar cell adjacent to the defective solar cell.

Effect of the Invention

The present invention is able to provide a manufacturing method suitable for solar modules.

BRIEF DESCRIPTION OF THE DRAWINGS

In FIG. 3, the region in which a resin adhesive layer is provided is cross-hatched. The cross-hatched region is not shown in cross-section.

In FIG. 10, the region in which a resin adhesive layer is provided is cross-hatched. The cross-hatched region is not shown in cross-section.

DETAILED DESCRIPTION

Figure 1:
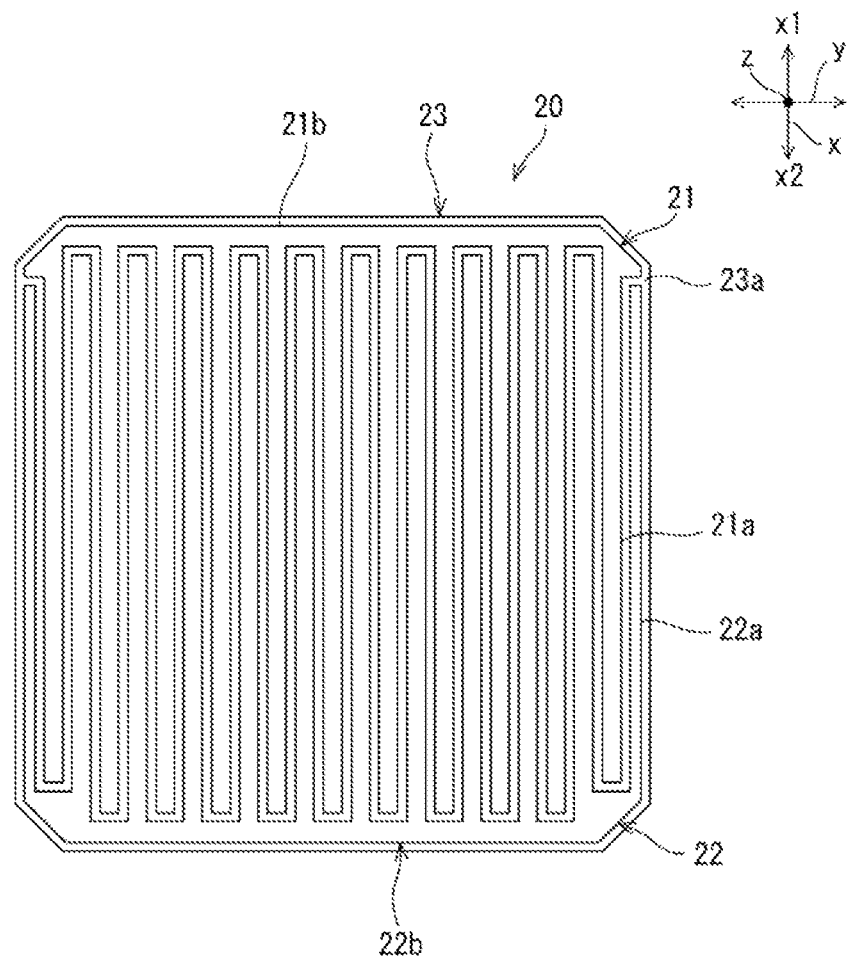
FIG. 1 is a simplified back view of a solar cell in the first embodiment.

The following is an explanation of examples of preferred embodiments of the present invention. The following embodiments are merely examples. The present invention is not limited by the following embodiments in any way.

Further, in each of the drawings referenced in the embodiments, members having substantially the same function are denoted by the same symbols. The drawings referenced in the embodiments are also depicted schematically. The dimensional ratios of the objects depicted in the drawings may differ from those of the actual objects. The dimensional ratios of objects may also vary between drawings. The specific dimensional ratios of the objects should be determined with reference to the following explanation.

1st Embodiment

Manufacturing Method for Solar Module 1

Figure 8:
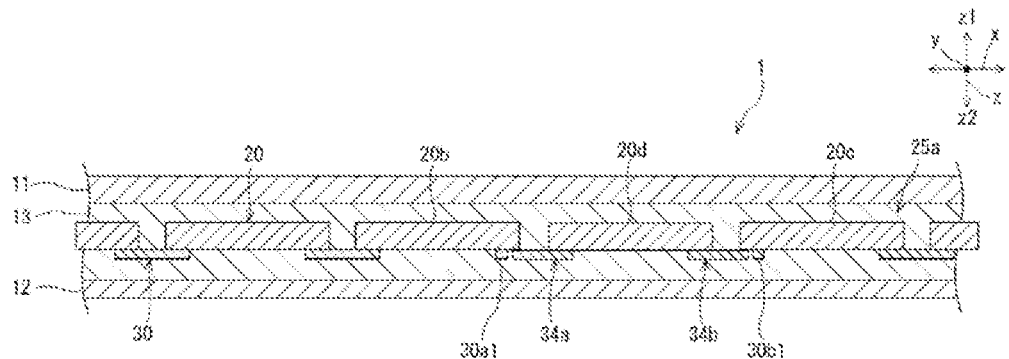
FIG. 8 is a simplified cross-sectional view of the solar module in the first embodiment.

The following is an explanation of an example of a manufacturing method for the solar module shown in FIG. 8 with reference to FIG. 1 through FIG. 8.

Process for Preparing Solar Cells 20

First, several of the solar cells 20 shown in FIG. 1 are prepared. In the present embodiment, the solar cells 20 are back contact solar cells.

Each solar cell 20 has a photoelectric conversion unit 23. When exposed to light, the photoelectric conversion unit 23 generates carriers such as electrons and holes. The photoelectric conversion unit 23 has a light-receiving surface (not shown) and a back surface 23a. The back surface 23a of the photoelectric conversion unit 23 has both a p-type surface and an n-type surface.

The photoelectric conversion unit 23 may include a crystalline semiconductor substrate, and a p-type semiconductor layer and an n-type semiconductor layer provided on the same main surface of the substrate. In this case, the p-type surface is composed of the p-type semiconductor layer. The n-type surface is composed of the n-type semiconductor layer. A substantially intrinsic i-type semiconductor layer may be interposed between the substrate and both the p-type semiconductor layer and the n-type semiconductor layer at a thickness ranging from several Å to 250 Å which does not substantially contribute to the generation of electricity.

The photoelectric conversion unit 23 may be composed of a crystalline semiconductor substrate having both a p-type dopant diffusion region and an n-type dopant diffusion region provided on one main surface.

The crystalline semiconductor substrate can be composed of single-crystal silicon. The p-type semiconductor layer can be composed of p-type amorphous silicon. The n-type semiconductor layer can be composed of n-type amorphous silicon. The i-type semiconductor layer can be composed of i-type amorphous silicon.

A first electrode 21 and a second electrode 22 are arranged on the back surface 23a of the photoelectric conversion unit 23. Either the first electrode 21 or the second electrode 22 is a p-side electrode, and the other electrode is the n-side electrode. The p-side electrode is connected electrically to the p-type surface and collects holes. The n-side electrode is connected electrically to the n-type surface and collects electrons.

Both the first electrode 21 and the second electrode 22 extend from one end to the other end in the x-direction (one direction).

Both the first electrode 21 and the second electrode 22 have a comb shape. More specifically, the first electrode 21 has a plurality of finger portions 21a and a first busbar portion 21b. The second electrode 22 has a plurality of second finger portions 22a and a second busbar portion 22b. Both the first finger portions 21a and the second finger portions 22a extend in the x-direction. The first finger portions 21a and the second finger portions 22a are interdigitated in the y-direction, which is perpendicular to the x-direction.

The first finger portions 21a are connected electrically to the first busbar portion 21b. The first busbar portion 21b is arranged in the x1 side of the first finger portions 21a in the x-direction. The first busbar portion 21b is arranged on the x1 end of the back surface 23a in the x-direction. The first busbar portion 21b extends in the y-direction.

The second finger portions 22a are connected electrically to the second busbar portion 22b. The second busbar portion 22b is arranged on the x2 side of the second finger portions 22a in the x-direction. The second busbar portion 22b is arranged on the x2 end of the back surface 23a in the x-direction. The second busbar portion 22b extends in the y-direction.

Process for Creation of Solar Cell String

Next, the prepared solar cells 20 are connected electrically. More specifically, a solar cell string 25 with a plurality of solar cells 20 connected electrically via wiring members 30 is created by using a wiring member 30 to electrically connect the first electrode 21 of a solar cell 20 to the second electrode 22 of the adjacent solar cell 20 in the x-direction. The solar cells 20 and the wiring members 30 are bonded by a resin adhesive layer 40 containing a cured resin adhesive.

The resin adhesive layer 40 may be composed of a cured resin adhesive or of a cured resin adhesive containing a conductive material. In this case, the wiring 32 of the wiring member 30 and the first or second electrode 21, 22 may be connected electrically via direct contact or may be connected electrically via indirect contact through the conductive material. When the resin adhesive layer 40 does not contain a conductive material, the wiring 32 and the first or second electrode 21, 22 are preferably connected electrically via direct contact.

Figure 3:
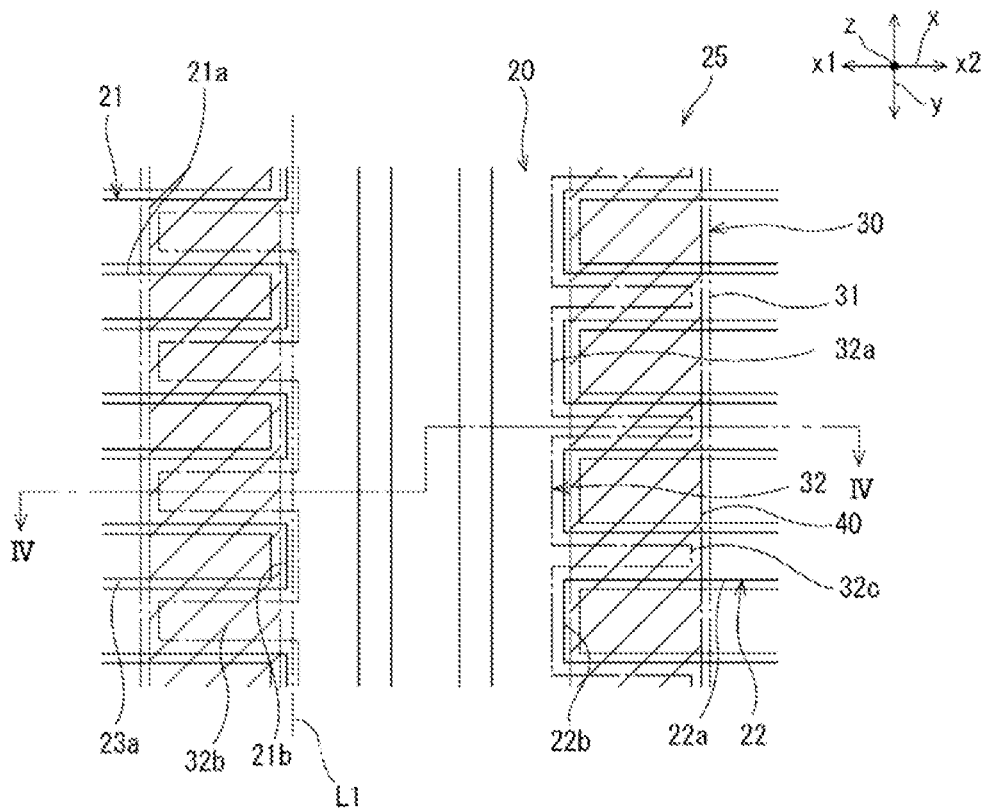
FIG. 3 is a simplified plan view of section III in FIG. 2.
Figure 4:
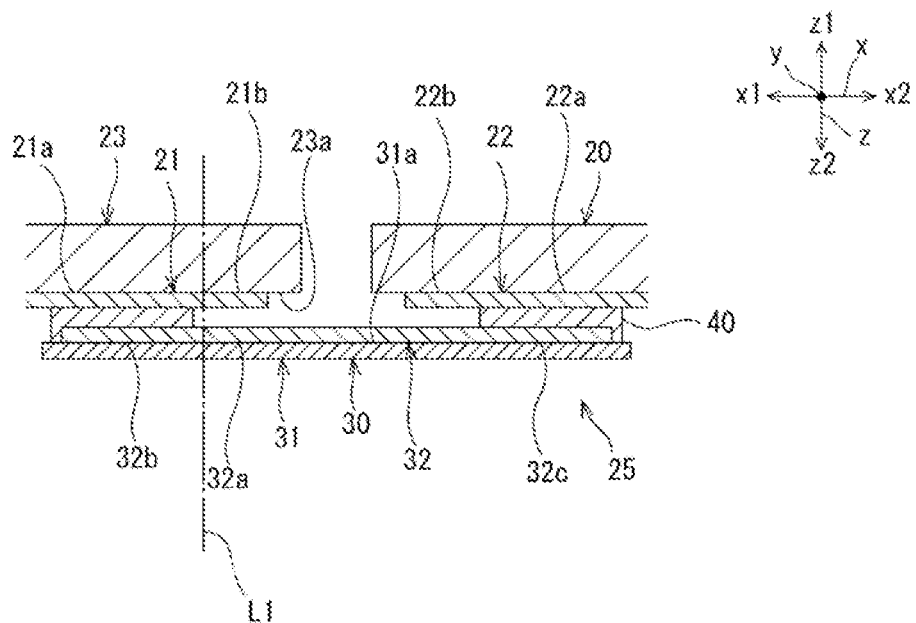
FIG. 4 is a simplified cross-sectional view from line IV-IV in FIG. 3.
Figure 5:
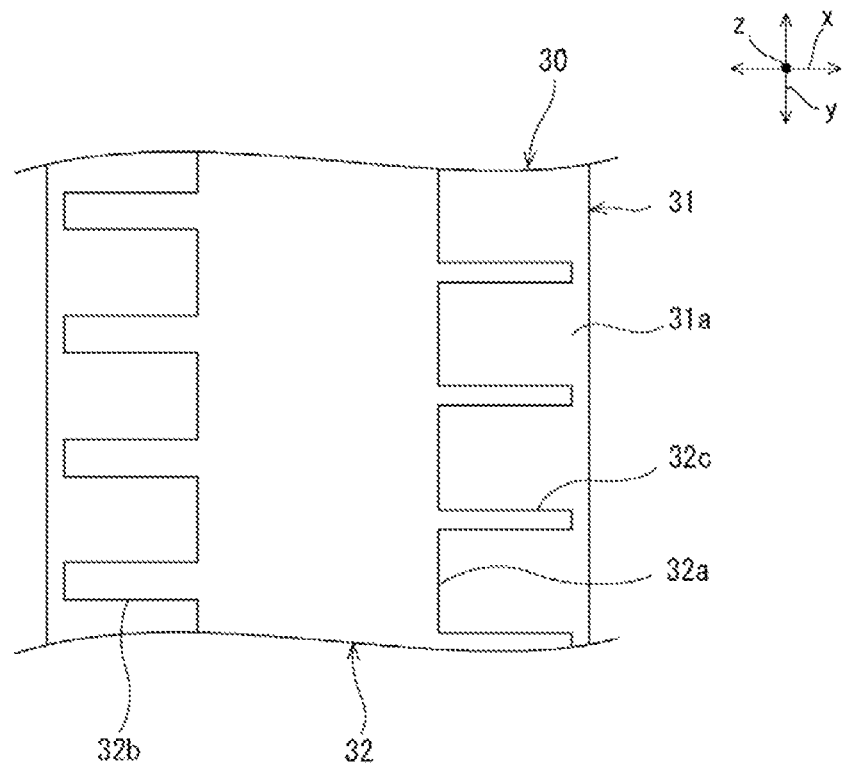
FIG. 5 is a simplified back view of a wiring member in the first embodiment.

Each wiring member 30 has a slender shape extending in the y-direction. More specifically, the wiring member 30 has a rectangular shape extending longitudinally in the y-direction. As shown in FIG. 3 through FIG. 5, the wiring member 30 has an insulating substrate 31 and wiring 32. The insulating substrate 31 can be made of a resin or a ceramic. The insulating substrate 31 can be, for example, a flexible resin substrate. In the present invention, "substrate" may refer to a flexible sheet or film.

The wiring 32 is arranged on the surface 31a of the insulating substrate 31 on the solar cell 20 side. The wiring 32 is arranged on the solar cell 20 side, and the insulating substrate 31 is arranged on the side opposite the solar cell 20. The wiring 32 has conductive properties and is used to electrically connect adjacent solar cells 20 in the x-direction.

The wiring 32 has a wiring main body 32a and a plurality of first and second linear portions 32b, 32c. The wiring main body 32a has a slender shape. More specifically, the wiring main body 32a is rectangular. The central portion of the wiring main body 32a extending in the x-direction of the insulating substrate 31 extends from one end of the insulating substrate 31 in the y-direction toward the other end, the y-direction being the direction in which the insulating substrate 31 extends.

Each of the first linear portions 32b extends from the wiring main body 32a in the x-direction towards the x1 end. The first linear portions 32b are arranged in the y-direction at a predetermined interval. Each of the first linear portions 32b is connected electrically to the wiring main body 32a.

Each of the second linear portions 32c extends from the wiring main body 32a in the x-direction towards the x2 end. The second linear portions 32c are arranged in the y-direction at a predetermined interval. Each of the second linear portions 32c is connected electrically to the wiring main body 32a.

In the solar cell string creating step, a wiring member 30 is bonded using a resin adhesive to a region of one solar cell 20 other than the region in which the x2 end of the first electrode 21 is arranged (including at least the first busbar portion 21b) with at least some of the first linear portions 32b positioned above the first finger portions 21a of the one solar cell 20. In this way, the first linear portions 32b of the wiring 32 of the wiring member 30 are connected electrically to the first finger portions 21a of the one solar cell 20. More specifically, in the present embodiment, the wiring member 30 is bonded to the region in which the first finger portions 21a of the one solar cell 20 are provided. As a result, at least some of the first busbar portion 21b of the first electrode 21 is exposed from the resin adhesive layer 40. In other words, at least some of the first busbar portion 21b of the first electrode 21 forms an unbonded region which is not bonded to the wiring member 30 by the resin adhesive layer 40. Some of the first finger portions 21a may be excluded from the unbonded region.

In the solar cell string creating step, the wiring member 30 is also bonded using a resin adhesive to a region of another solar cell 20 other than the region in which the x1 end of the second electrode 22 is arranged in the x-direction (including at least the second busbar portion 22b) with at least some of the second linear portions 32c positioned above the second finger portions 22a of the other solar cell 20. In this way, the second linear portions 32c of the wiring 32 of the wiring member 30 are connected electrically to the second finger portions 22a of the other solar cell 20. More specifically, in the present embodiment, the wiring member 30 is bonded to the region in which the second finger portions 22a of the other solar cell 20 are provided. As a result, at least some of the second busbar portion 22b of the second electrode 22 is exposed from the resin adhesive layer 40. In other words, at least some of the second busbar portion 22b of the second electrode 22 forms an unbonded region which is not bonded to the wiring member 30 by the resin adhesive layer 40. Some of the second finger portions 22a may be excluded from the unbonded region.

In the present embodiment, the first linear portions 32b are not electrically connected directly to the busbar portion 21b. However, in the present invention, the first linear portions may be electrically connected directly to the busbar portion instead of via finger portions. In the present embodiment, the second linear portions 32c are not electrically connected directly to the busbar portion 22b. However, in the present invention, the second linear portions may be electrically connected directly to the busbar portion instead of via finger portions.

Disconnecting Process

Next, the solar cell string 25 is inspected for the presence of any defective solar cell (inspection process). Here, a defective solar cell means any solar cell that is scratched or damaged, or any solar cell whose semiconductor junctions have not been formed properly and which does not generate electricity when exposed to light. In other words, defective solar cells include physically defective solar cells and electrically defective solar cells.

There are no particular restrictions on the inspection process. Defective solar cells can be detected by performing a visual inspection using a microscope, an inspection using the photoluminescence (PL) method in which fluorescent light is detected when light is incident on the light-receiving surface, and an inspection using the electroluminescence (EL) method in which fluorescent light is detected when voltage is applied.

Figure 2:
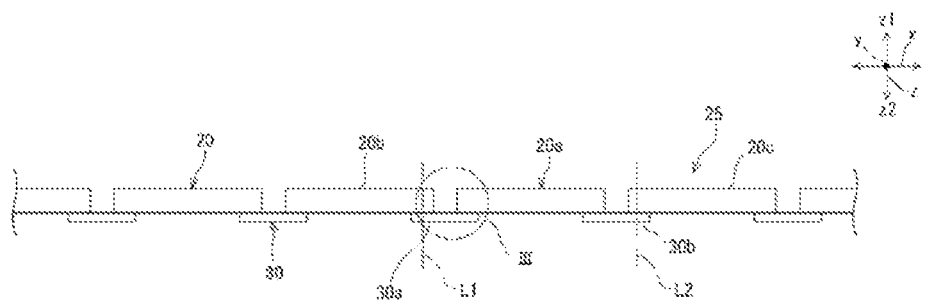
FIG. 2 is a simplified side view of a solar cell string in the first embodiment.

In the explanation of the present embodiment, only solar cell 20a in FIG. 2 is found to be defective among the solar cells 20 of the solar cell string 25.

In the present embodiment, because solar cell 20a was found to be defective in the inspection process, solar cell 20a has to be replaced. When no defective solar cells are found in the inspection process, none of the solar cells is replaced.

When solar cell 20a is replaced, solar cell 20a is first removed from the solar cell string 25. More specifically, the solar cell 20a found to be defective and the wiring members 30a, 30b bonded to the solar cells 20b, 20c adjacent to the solar cell 20a are cut (disconnecting process).

More specifically, the unbonded portion of wiring member 30a not bonded to the solar cells 20 is cut along cut line L1 between the portion bonded to solar cell 20a and the portion bonded to solar cell 20b. Also, the unbonded portion of wiring member 30b not bonded to the solar cells 20 is cut along cut line L2 between the portion bonded to solar cell 20a and the portion bonded to solar cell 20c. Afterwards, solar cell 20a is removed from the solar cell string 25.

Even more specifically, wiring members 30a and 30b of the solar cells 20b, 20c are disconnected so as to expose the wiring members 30a, 30b from the disconnected ends 30a1, 30b1 of the wiring members 30a, 30b in the unbonded portion not bonded to the wiring members 30a, 30b of the electrically connected electrodes. Even more specifically, the wiring members 30a, 30b are disconnected above the base portions of the finger portions 21a, 22a connected to the busbar portions 21b, 22b. As a result, the solar cells 20b, 20c remain bonded to the disconnected ends 30a1, 30b1 of the wiring members 30a, 30b. The disconnected ends 30a1, 30b1 are bonded to the regions of the solar cells 20b, 20c in which the first or second finger portions 21a, 22a are provided. The disconnected ends 30a1, 30b1 are not arranged in a portion of the region in which at least the busbar portion 21b, 22b of the first or second electrode 21, 22 are provided.

Reconnecting Process

Next, a new solar cell 20d is prepared. Here, the new solar cell is a solar cell that was not included in the solar cell string inspected in the inspection process, and may be an unused solar cell or a solar cell that has been used before but is defect free.

Next, the new solar cell 20d is connected to solar cells 20b and 20c using new wiring members 34a, 34b. In this way, a new solar cell string 25a is created.

As in the case of wiring member 30, wiring members 34a and 34b have an insulating substrate 35 and wiring 36. Wiring members 34a and 34b may have a configuration that is substantially the same as or different from wiring member 30.

More specifically, the new solar cell 20d and new wiring member 34a are bonded using a resin adhesive to electrically connect the second electrode 22 of the new solar cell 20d to the wiring 36 of the wiring member 34a. In this way, the wiring member 34a and the solar cell 20d are bonded via a resin adhesive layer 41. Also, the wiring member 34a is bonded to solar cell 20b using a resin adhesive in a region closer to the x2 end than the region in which the disconnected end 30a1 is bonded. More specifically, the wiring member 34a is bonded using a resin adhesive to the region of the solar cell 20b in which the first busbar portion 21b is provided. In this way, the wiring 36 of the wiring member 34a is connected electrically to the first busbar portion 21b of the solar cell 20b. The solar cell 20b and the wiring member 34a are bonded via a resin adhesive layer 42. This process electrically connects the new solar cell 20d to solar cell 20b.

Similarly, the new solar cell 20d and solar cell 20c are connected electrically using a new wiring member 34b. The first electrode 21 of the new solar cell 20d is connected electrically to the wiring 36 of the wiring member 34b. The second busbar portion 22b of the second electrode 22 of solar cell 20c is also connected electrically to the wiring 36 of the new wiring member 34b.

In this way, a new solar cell string 25a including the new solar cell 20d is created.

The reconnecting process is preferably performed in a way that does not bend the new wiring members 34a, 34b.

Lamination Process

Next, as shown in FIG. 8, the solar cell string 25a is sealed between first and second protecting members 12, 11 using a bonding layer 13. More specifically, a resin sheet such as an EVA sheet constituting a portion of the bonding layer 13 is placed on the second protecting member 11. The solar cell string 25a is placed on top of this resin sheet, a resin sheet such as an EVA sheet constituting a portion of the bonding layer 13 is placed on top of this, and the first protecting member 12 is placed on top of this. These can then be laminated in a reduced-pressure atmosphere to complete the solar module 1.

Configuration of Solar Module 1

The solar module 1 manufactured in this manner has a solar cell string 25a sealed inside a bonding layer 13 between the first and second protecting members 12, 11. The solar cell string 25a has a plurality of solar cells 20. These solar cells 20 are connected electrically via wiring members 30, 34a, 34b. The wiring members 30, 34a, 34b and the solar cells 20 are bonded via resin adhesive layers 40, 41, 42 including a cured resin adhesive.

The disconnected ends 30a1, 30b1 are bonded by the resin adhesive layer 40 to solar cells 20b and 20c among the solar cells 20. The disconnected ends 30a1, 30b1 are positioned above the region in which the first and second finger portions 21a, 22a are provided. The disconnected ends 30a1, 30b1 are connected electrically to either the first or second finger portions 21a, 22a. More specifically, the disconnected ends 30a1, 30b1 have an insulating substrate 31 and wiring 32 connected electrically to either the first or second finger portions 21a, 22a. The disconnected ends 30a1, 30b1 may be insulated or electrically connected to the wiring members 34a, 34b.

In the explanation of the present embodiment, new wiring members 34a, 34b are bonded to a region closer to the end of the solar cells 20b, 20c than the region in which the disconnected ends 30a1, 30b1 are bonded. Therefore, the new wiring members 34a, 34b do not straddle the disconnected ends 30a1, 30b1. This can suppress bending of the wiring members 34a, 34b. As a result, the wiring members 34a, 34b are less likely to break, and a solar module 1 with superior reliability can be manufactured. When a wiring member becomes bent, the bonding material does not completely fill the portion near the bent portion of the wiring member. Because the wiring members 34a, 34b in the present embodiment are not bent, they are reliably filled by the bonding layer 13. Air pockets are less likely to be formed in the bonding layer 13, and a solar module 1 with superior weather resistance can be manufactured.

From the standpoint of greater reliability and weather resistance, the reconnecting process is preferably performed so as not to bend the wiring members 34a, 34b.

Figure 6:
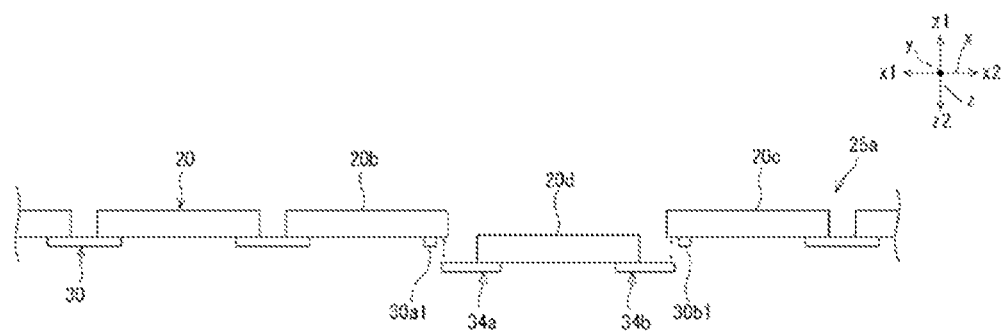
FIG. 6 is a simplified side view used to explain the solar module manufacturing process in the first embodiment.
Figure 7:
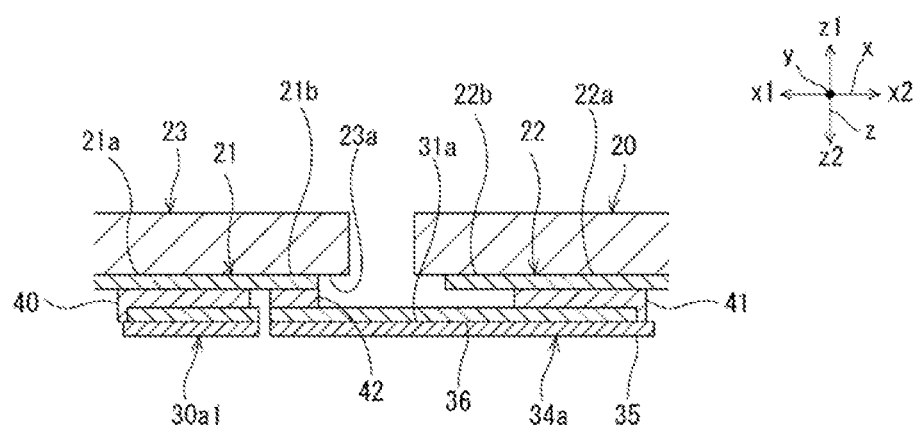
FIG. 7 is a simplified cross-sectional view used to explain the solar module manufacturing process in the first embodiment.

The following is an explanation of another example of a preferred embodiment of the present invention. In the following explanation, any member having a function substantially identical to a member of the first embodiment is referenced by the same reference symbol and further explanation of the member is omitted. In the second embodiment, FIG. 2, FIG. 5 and FIG. 6 are referenced in the same manner as the first embodiment.

2nd Embodiment

Figure 9:
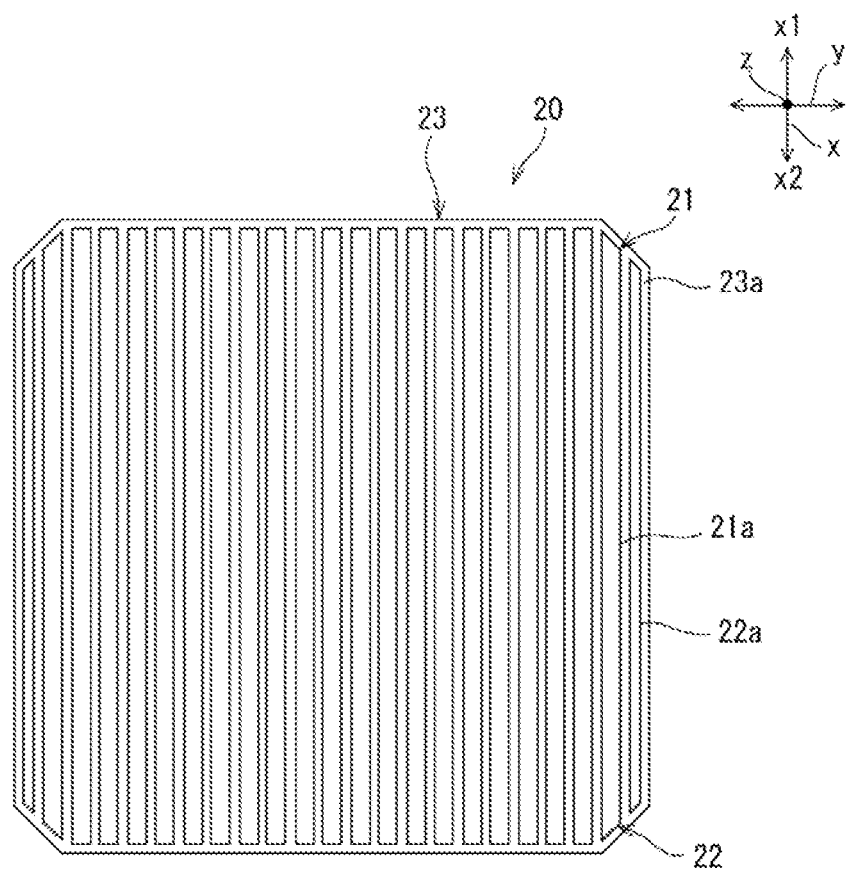
FIG. 9 is a simplified back view of a solar cell in the second embodiment.

In the explanation of the example of the first embodiment, both the first and second electrodes 21, 22 have busbar portions 21b, 22b. However, in the example of the second embodiment, as shown in FIG. 9, both the first and second electrodes 21, 22 are busbarless electrodes composed of finger portions 21a, 22a.

Figure 10:
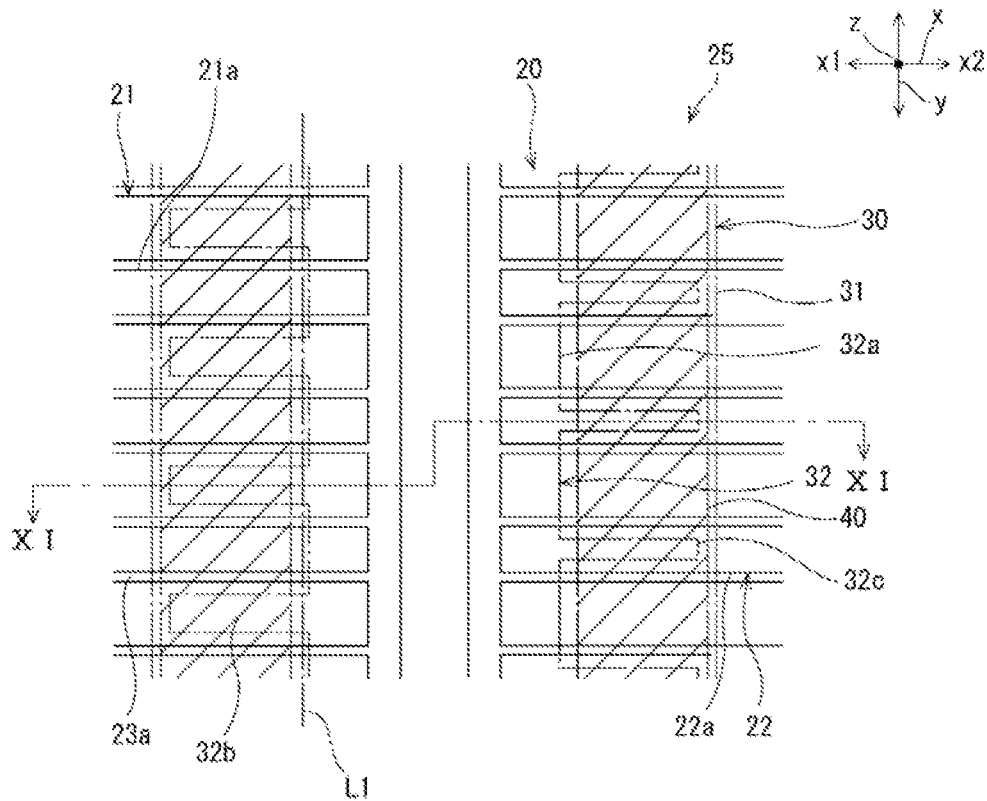
FIG. 10 is a simplified partial side view of a solar cell string in the second embodiment.
Figure 11:
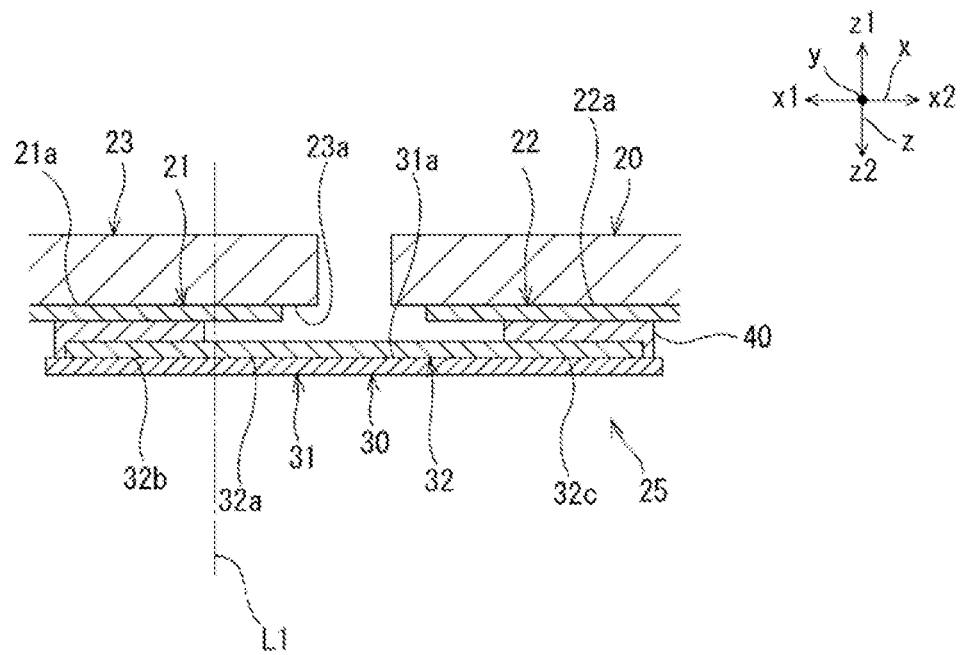
FIG. 11 is a simplified cross-sectional view from line XI-XI in FIG. 10.

In the second embodiment, during the solar cell string manufacturing process, as shown in FIG. 10 and FIG. 11, a wiring member 30 is bonded to one solar cell 20 of two adjacent solar cells 20 in the x direction in a region other than the region on the x2 end of the first finger portions 21a in the x direction. In this way, the wiring member 30 is connected electrically to the first finger portions 21a of the one solar cell 20. Also, the wiring member 30 is bonded to the other solar cell 20 of the two adjacent solar cells 20 in the x direction in a region other than the region on the x1 end of the second finger portions 22a in the x direction. In this way, the wiring member 30 is connected electrically to the second finger portions 22a of the other solar cell 20. This process creates a solar cell string 25 in which solar cells 20 have been connected electrically via a wiring member 30.

In other words, in the present embodiment, during the solar cell string manufacturing process, the ends of the first and second finger portions 21a, 22a in the x-direction form an unbonded region that is not bonded to the wiring member 30. As a result, the disconnected ends 30a1, 30b1 are bonded to a region of the solar cells 20b, 20c other than the region in which the ends of the finger portions 21a, 22a are provided in the x direction.

Figure 12:
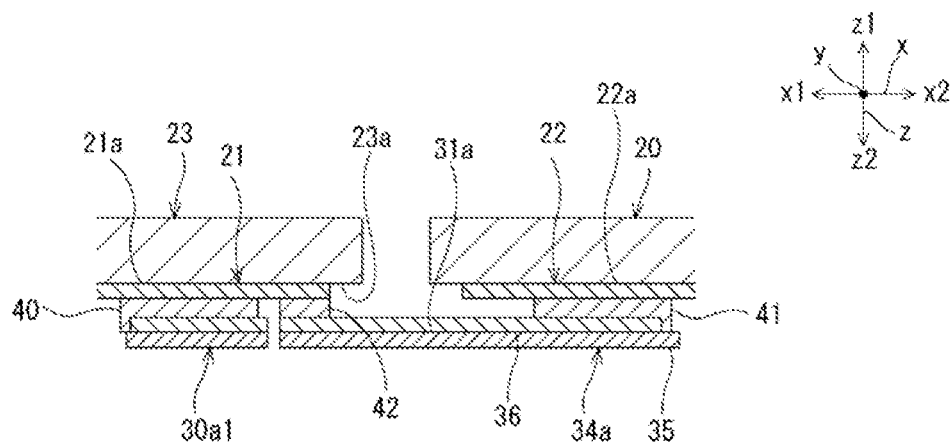
FIG. 12 is a simplified cross-sectional view used to explain the solar module manufacturing process in the second embodiment.
Figure 13:
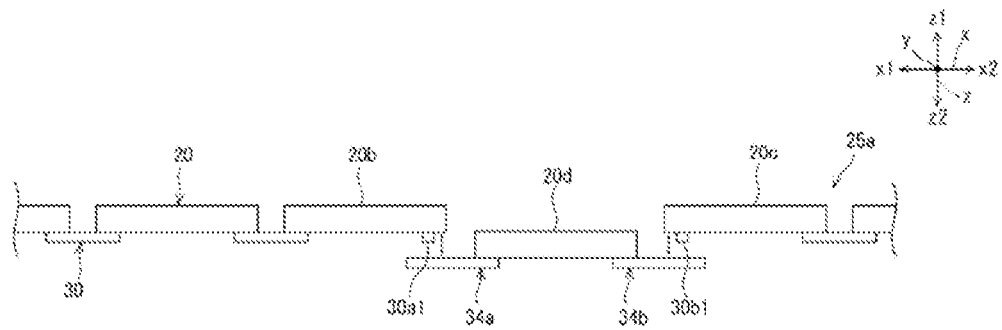
FIG. 13 is a simplified side view used to explain the solar module manufacturing process in the third embodiment.
Figure 14:
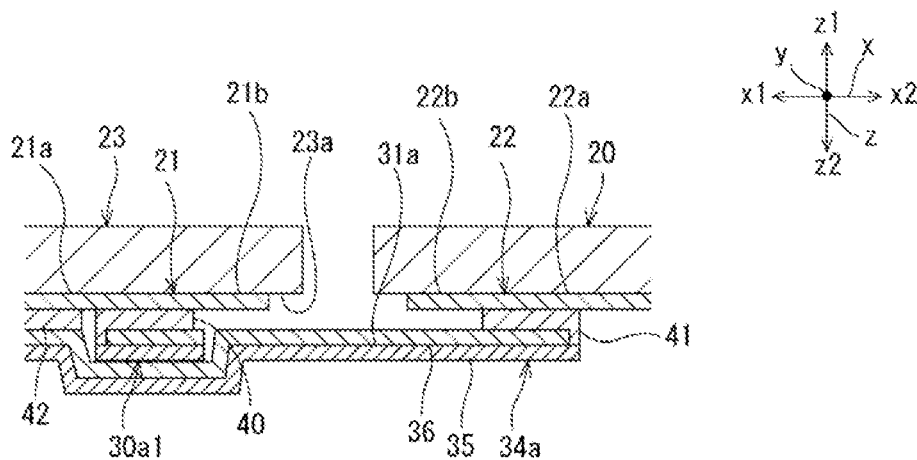
FIG. 14 is a simplified cross-sectional view used to explain the solar module manufacturing process in the third embodiment.

In the present embodiment, during the reconnecting process, as shown in FIG. 12, the wiring members 34a, 34b are connected electrically to either the first or second finger portions 21a, 22a of the solar cells 20b, 20c in a region closer to the end of the solar cells 20b, 20c in the x-direction than the region in which the disconnected ends 30a1, 30b1 are bonded. In this way, the wiring members 34a, 34b are connected to either the first or second finger portions 21a, 22a of the solar cells 20b, 20c.

As in the case of the first embodiment, the second embodiment can prevent the formation of bent portions in the wiring members 34a, 34b. Therefore, the wiring members 34a, 34b are less likely to break, and a solar module 1 with superior reliability can be manufactured. A solar module 1 with superior weather resistance can also be manufactured.

3rd Embodiment

In the present embodiment, FIG. 1 through FIG. 5 are referenced in the same manner as the first embodiment. The explanation of the first embodiment with reference to FIG. 1 through FIG. 5 also applies to the present embodiment.

During the solar cell string manufacturing process, a wiring member 30 is bonded using a resin adhesive to a portion outside of the end portion of the one adjacent solar cell 20 in the x direction, and the wiring member 30 is bonded using a resin adhesive to a portion outside of the end portion of the other adjacent solar cell 20 in the x direction. In other words, the wiring members 30 are not bonded to the end portions of the solar cells 20. In this way, an unbonded region that is not bonded to wiring members 30 is provided in the end portions of the solar cells 20 in the x-direction.

Disconnecting Process

Next, the solar cell string 25 is inspected for the presence of any defective solar cell (inspection process). Here, a defective solar cell means any solar cell that is scratched or damaged, or any solar cell whose semiconductor junctions have not been formed properly and which does not generate electricity when exposed to light. In other words, defective solar cells include physically defective solar cells and electrically defective solar cells.

There are no particular restrictions on the inspection process. Defective solar cells can be detected by performing a visual inspection using a microscope, an inspection using the photoluminescence (PL) method in which fluorescent light is detected when light is incident on the light-receiving surface, and an inspection using the electroluminescence (EL) method in which fluorescent light is detected when voltage is applied.

In the explanation of the present embodiment, only solar cell 20a in FIG. 2 is found to be defective among the solar cells 20 of the solar cell string 25.

In the present embodiment, because solar cell 20a was found to be defective in the inspection process, solar cell 20a has to be replaced. When no defective solar cells are found in the inspection process, none of the solar cells is replaced.

When solar cell 20a is replaced, solar cell 20a is first removed from the solar cell string 25. More specifically, the solar cell 20a found to be defective is severed from the wiring members 30a, 30b bonded to the solar cells 20b, 20c adjacent to the solar cell 20a.

More specifically, the unbonded portion of wiring member 30a not bonded to the solar cells 20 is cut along cut line L1 between the portion bonded to solar cell 20a and the portion bonded to solar cell 20b. Also, the unbonded portion of wiring member 30b not bonded to the solar cells 20 is cut along cut line L2 between the portion bonded to solar cell 20a and the portion bonded to solar cell 20c. Afterwards, solar cell 20a is removed from the solar cell string 25.

There are no particular restrictions on the positions of cut lines L1 and L2 as long as they are positioned in a portion of the wiring members 30a, 30b not bonded to the solar cells 20 via the resin adhesive layer 40. The cut lines L1, L2 may be above solar cells 20b and 20c, or between solar cell 20a and solar cells 20b and 20c.

Reconnecting Process

Next, a new solar cell 20d is prepared. Here, the new solar cell is a solar cell that was not included in the solar cell string inspected in the inspection process, and may be an unused solar cell or a solar cell that has been used before but is defect free.

Next, the new solar cell 20d is connected to solar cells 20b and 20c using new wiring members 34a, 34b. In this way, a new solar cell string 25a is created.

As in the case of the wiring member 30, wiring members 34a and 34b have an insulating substrate 35 and wiring 36. Wiring members 34a and 34b may have a configuration that is substantially the same as or different from the wiring member 30.

More specifically, the new solar cell 20d and the new wiring members 34a, 34b are bonded using a resin adhesive to electrically connect the first electrode 21 or the second electrode 22 of the new solar cell 20d to the wiring 36 of the wiring members 34a, 34b. As a result, the wiring members 34a, 34b and the solar cell 20d are bonded by a resin adhesive layer 41.

Even more specifically, the new wiring members 34a, 34b are bonded using a resin adhesive to a portion of the new solar cell 20d other than the end portions in the x-direction. In other words, the wiring members 34a, 34b are not bonded to the end portions of the solar cell 20d. In this way, a region not bonded to the wiring members 34a, 34b are provided in the end portions of the solar cell 20d in the x-direction. More specifically, the wiring members 34a, 34b are not bonded to the end portions of the solar cell 20d in the regions where the first and second electrodes 21, 22 are provided. In this way, regions that are not bonded to the wiring members 34a, 34b are provided in the end portions of the solar cell 20d where the first and second electrodes 21, 22 are provided.

Also, the new wiring members 34a, 34b are provided so as to straddle the disconnected ends 30a1, 30b1 in the x-direction, are bonded using a resin adhesive to the solar cells 20b, 20c in a region closer to the center than the region in which a disconnected end 30a1, 30b1 is provided. In this way, the wiring members 34a, 34b are connected electrically to the either the first or second electrodes 21, 22 of the solar cells 20b, 20c. The wiring members 34a, 34b are bonded via a resin adhesive layer 42 to a region of the solar cells 20b, 20c in a region other than the end portions in the x-direction.

Lamination Process

Figure 15:
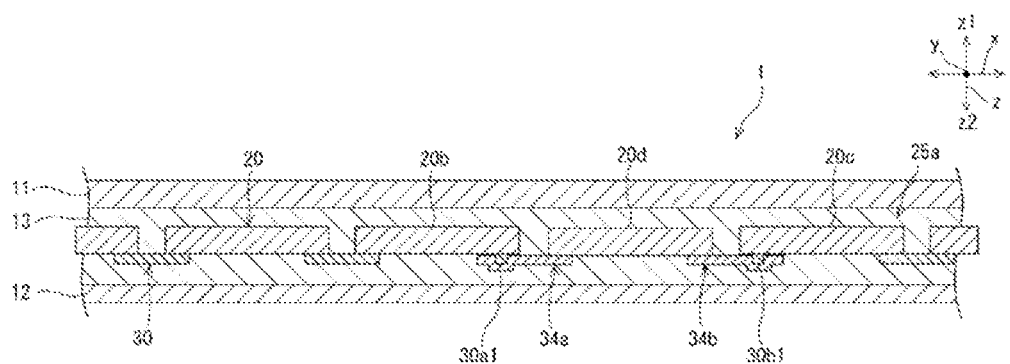
FIG. 15 is a simplified cross-sectional view of the solar module in the third embodiment.

Next, as shown in FIG. 15, the solar cell string 25a is sealed between first and second protecting members 12, 11 using a bonding layer 13. More specifically, a resin sheet such as an EVA sheet constituting a portion of the bonding layer 13 is placed on the second protecting member 11. The solar cell string 25a is placed on top of this resin sheet, a resin sheet such as an EVA sheet constituting a portion of the bonding layer 13 is placed on top of this, and the first protecting member 12 is placed on top of this. These can then be laminated in a reduced-pressure atmosphere to complete the solar module 1.

Configuration of Solar Module 1

The solar module 1 manufactured in this manner has a solar cell string 25a sealed inside a bonding layer 13 between the first and second protecting members 12, 11. The solar cell string 25a has a plurality of solar cells 20. These solar cells 20 are connected electrically via wiring members 30, 34a, 34b. The wiring members 30, 34a, 34b and the solar cells 20 are bonded via resin adhesive layers 40, 41, 42 containing a cured resin adhesive. Each of the wiring members 30, 34a, 34b is not bonded to the end portions of the solar cells 20 in the x-direction.

The disconnected ends 30a1, 30b1 of wiring members 30a and 30b are bonded via a resin adhesive layer 40 on solar cells 20b, 20b among the solar cells 20. The wiring members 34a, 34b are arranged so as to straddle the disconnected ends 30a1, 30b1 in the x-direction. The wiring members 34a, 34b are bonded to the solar cells 20b, 20c via a resin adhesive layer 42 closer to the center in the x-direction than the disconnected ends 30a1, 30b1. In other words, the wiring members 34a, 34b are bonded to a portion of the solar cells 20b, 20c other than the end portions in the x-direction.

As explained above, in the present invention, during the solar cell string manufacturing process, a wiring member 30 is bonded using a resin adhesive to a portion outside of the x1 end portion of the one adjacent solar cell 20 in the x direction, and the wiring member 30 is bonded using a resin adhesive to a portion outside of the x2 end portion of the other adjacent solar cell 20 in the x direction. More specifically, the resin adhesive is heated and cured with the resin adhesive interposed between the solar cell 20 and the wiring member 30 and with pressure applied in a direction bringing the solar cell 20 and the wiring member 30 closer to each other. As a result, pressure does not have to be applied to the end portion of the solar cell 20 when the solar cell 20 and the wiring member 30 are bonded using a resin adhesive. Therefore, cracking is less likely to occur in the solar cells 20 during the solar cell string manufacturing process.

Also, during the reconnecting process, the new wiring members 34a, 34b are bonded using a resin adhesive to a region of the solar cells 20b, 20c closer to the center than the region in which the disconnected ends 30a1, 30b1 are bonded. More specifically, the resin adhesive is heated and cured with the resin adhesive interposed between the solar cells 20b, 20c and the wiring members 34a, 34b and with pressure applied in a direction bringing the solar cells 20b, 20c and the wiring members 34a, 34b closer together. As a result, pressure does not have to be applied to the end portion of the solar cells 20b, 20c when the solar cells 20b, 20c and the wiring members 34a, 34b are bonded using a resin adhesive. Therefore, cracking is less likely to occur in the solar cells 20b, 20c during the reconnecting process.

In this way, a solar module 1 can be manufactured more efficiently and at a higher yield rate.

In the present embodiment, the new wiring members 34a, 34b are bonded using a resin adhesive to a portion of the new solar cell 20d other than an end portion in the x-direction. More specifically, the resin adhesive is heated and cured with the resin adhesive interposed between the solar cell 20d and the wiring members 34a, 34b and with pressure applied in a direction bringing the solar cell 20d and the wiring members 34a, 34b closer together. As a result, pressure does not have to be applied to the end portion of the solar cell 20d when the solar cells 20d and the wiring members 34a, 34b are bonded using a resin adhesive. Therefore, cracking is less likely to occur in the solar cell 20d during the reconnecting process. In this way, a solar module 1 can be manufactured more efficiently and at a higher yield rate.

In the explanation of an example of the present embodiment, both the first and second electrodes 21, 22 have a busbar portion 21b, 22b. However, the present invention is not limited to this configuration. For example, as shown in FIG. 9, both the first electrode 21 and the second electrode 22 are busbarless electrodes composed of a plurality of finger portions 21a, 22a.

Also, in the present embodiment, during the disconnecting process for disconnecting the defective solar cell 20a, the unbonded portions of the wiring members 30a not bonded to a solar cell 20 were cut to remove the solar cell 20a. However, the present invention is not restricted to this method. For example, the wiring member 30a may be removed from the solar cell 20b so as to leave the resin adhesive layer 40 on the solar cell 20b. In this case, the new wiring member 34a is bonded using a resin adhesive to the new solar cell 20d so as to straddle the resin adhesive layer 40 remaining on the solar cell 20b. In other words, the new wiring member 34a is bonded using a resin adhesive to the solar cell 20b in a region closer to the center than the resin adhesive layer 40 remaining on the solar cell.

The present invention includes many other embodiments not described herein. Therefore, the technical scope of the present invention is defined solely by the items of the invention specified in the claims pertinent to the above explanation.

KEY TO THE DRAWINGS

1: Solar module
11: 2nd protecting member
12: 1st protecting member
13: Bonding layer
20, 20a-20c: Solar cell
20d: New solar cell
21: 1st electrode
21a: 1st finger portion
21b: 1st busbar portion
22: 2nd electrode
22a: 2nd finger portion
22b: 2nd busbar portion
23: Photoelectric conversion unit
23a: Back surface
25: Solar cell string
25a: New solar cell string
30, 30a, 30b: Wiring member
30a1, 30b1: Disconnected ends
31: Insulating substrate
32: Wiring
32b: 1st linear portion
32c: 2nd linear portion
34a, 34b: New wiring member
40, 41, 42: Resin adhesive layer

What is claimed is:

1. A method for manufacturing a solar module comprising the steps of:
preparing a plurality of solar cells having a first electrode and a second electrode on the same main surface and arranged so each first electrode and second electrode extends from one end to the other end in one direction;
creating a solar cell string in which a plurality of solar cells are connected electrically by using a resin adhesive to connect a wiring member to a connection region other than the end portion of the first electrode of one solar cell in the one direction in order to electrically connect the wiring member to the first electrode of the one solar cell, while using a resin adhesive to connect the wiring member to a connection region other than the end portion of the second electrode of another solar cell in the one direction in order to electrically connect the wiring member to the second electrode of the other solar cell, such that the end portion of the first electrode and the end portion of the second electrode are exposed from the resin adhesive;
cutting, when a defective solar cell has been discovered, a wiring member bonding the defective solar cell to the solar cell adjacent to the defective solar cell and removing the defective solar cell from the solar cell string while leaving the cut wiring member bonded to the solar cell adjacent to the defective solar cell; and
electrically connecting the solar cells adjacent to the defective solar cell to a new solar cell using a new wiring member to create a new solar cell string, the new wiring member being bonded using a resin adhesive to the exposed end portion of the first electrode or the second electrode in an exposed region closer to the end than the cut end of the cut wiring member having been bonded to the solar cell adjacent to the defective solar cell.

2. The method for manufacturing a solar module according to claim 1, wherein the first electrode has a plurality of first finger portions extending in the one direction, and a first busbar portion arranged to one side of the first finger portions in the one direction and connected electrically to the first finger portions;
the second electrode has a plurality of second finger portions extending in the one direction, and a second busbar portion arranged to one side of the second finger portions in the one direction and connected electrically to the second finger portions;
each wiring member is bonded to the first finger portions of the one solar cell in the connection region and to the second finger portions of the other solar cell in the connection region in the solar cell string creating step; and
the new wiring member is bonded to the first busbar portion or the second buabar portion of the solar cell adjacent to the defective solar cell in the exposed region in the reconnecting step.

3. The method for manufacturing a solar module according to claim 1, wherein the first electrode has a plurality of first finger portions extending in the one direction;
the first electrode has a plurality of second finger portions extending in the one direction;
each wiring member is bonded to the first finger portions of the one solar cell in the connection region, and the wiring member is bonded to the second finger portion of the other solar cell in the connection region in the solar cell string creating step; and
the new wiring member is connected electrically to the first finger portions or to the second finger portions in the exposed region in the reconnecting step.

4. The method for manufacturing a solar module according to claim 1, wherein the new solar cell string is sealed using resin.

5. The method for manufacturing a solar module according to claim 4, wherein a resin sheet is applied to both sides of the new solar cell string, and the new solar cell string is sealed using lamination.

* * * * *